(12) United States Patent
Park et al.

(10) Patent No.: US 7,800,450 B2
(45) Date of Patent: Sep. 21, 2010

(54) RE-CONFIGURABLE LOW NOISE AMPLIFIER UTILIZING FEEDBACK CAPACITORS

(75) Inventors: Jae-woo Park, Seoulsi (KR); Chang-sik Yoo, Seoulsi (KR)

(73) Assignee: Silicon Motion, Inc., Zhubei (TW)

( * ) Notice: Subject to any disclaimer, the term of this patent is extended or adjusted under 35 U.S.C. 154(b) by 66 days.

(21) Appl. No.: 12/358,419

(22) Filed: Jan. 23, 2009

(65) Prior Publication Data

US 2009/0195316 A1    Aug. 6, 2009

(30) Foreign Application Priority Data

Feb. 1, 2008    (KR) ...................... 10-2008-0010471

(51) Int. Cl.
*H03F 3/68*    (2006.01)
(52) U.S. Cl. ........................ 330/311; 330/126
(58) Field of Classification Search ............. 330/51, 330/125, 311; 455/191.3, 150.1
See application file for complete search history.

(56) References Cited

U.S. PATENT DOCUMENTS 6,211,737 B1 *   4/2001   Fong ......................... 330/282

* cited by examiner

*Primary Examiner*—Robert Pascal
*Assistant Examiner*—Khiem D Nguyen
(74) *Attorney, Agent, or Firm*—Kirton & McConkie; Evan R. Witt

(57) ABSTRACT

A re-configurable low noise amplifier utilizing feedback capacitors is disclosed. The low noise amplifier has output transistors, capacitor switch cells, and capacitance distributors all in an output portion. The output transistors are for controlling selection of a specific frequency band in a wide band of frequencies. The capacitor switch cells are for adjusting a harmonic frequency for the specific frequency band. The capacitance distributor is for determining an amount of gain, and according to the gain, an output impedance feeds back to an input portion of the low noise amplifier for input matching. Since the output portion is at high impedance and suitable for a wide band of frequencies, input matching not only makes the low noise amplifier applicable to kinds of wireless communication standards, but also fulfills high gain and low noise figure.

12 Claims, 4 Drawing Sheets

RE-CONFIGURABLE LOW NOISE AMPLIFIER UTILIZING FEEDBACK CAPACITORS

TECHNICAL FIELD OF THE INVENTION

The present invention relates to a low noise amplifier, and more particularly, to a re-configurable low noise amplifier utilizing feedback capacitors.

BACKGROUND OF THE INVENTION

A low noise amplifier (LNA) is often utilized in a communication system. The main function of the low noise amplifier is to amplify weak signals received from an antenna and process the received signals to be low noise figure signals.

Recently, the researches for utilizing only one terminal to support kinds of wireless communication standards grew vigorously. The technique in this field is mainly classified into two types. One type is to connect a plurality of low noise amplifiers in parallel, and each low noise amplifier supports a specific frequency in a communication system. This type only supports one kind of wireless communication standards. The other type is a low noise amplifier capable of supporting kinds of wireless communication standards or a wide band of frequencies. However, this type of low noise amplifier has high noise figure and the gain thereof is easily decreased.

Some low noise amplifiers use a load of low impedance in order to support a wide frequency range. This type of low noise amplifier has problems of decreasing the gain and raising high noise figure. In addition, some low noise amplifiers utilize a plurality of inductors for input matching and add band pass filters in the input portion. However, the inductors sizes may be huge. Integrating the plural inductors will lead to low efficiency. Moreover, parasitic resistance resided in the chip may raise noise figure.

To make input matching to meet with operating frequencies, a circuit for input matching can be added in the input portion. However, the added circuit will increase parasitic capacitance or resistance in the input portion. This may decrease the gain.

In addition, the added circuit will generate noise signals. When the noise signals are propagated to the output portion, it may result in high noise figure and aggravate gradually.

The present invention provides a re-configurable low noise amplifier utilizing feedback capacitors. The output portion of the low noise amplifier is maintained at high impedance and feeds the output impedance, which is amplified according to a gain determined by a capacitance distributor, back to the input portion. The input portion is able to receive signals in a wide band of frequencies and the output portion is able to output signals of various frequency bands. The present invention fulfills high gain and low noise figure without adding an additional circuit in the input portion.

To support signals in a wide band of frequencies, the low noise amplifier has output transistors in the output portion and the output transistors have a switch function. To satisfy different standards, the low noise amplifier has capacitor switch cells in the output portion and the capacitor switch cells are able to slightly adjust harmonic frequencies according to a predetermined mode so as to prevent lowering the gain and increasing noise figure. In addition, the low noise amplifier is re-configurable.

In the present invention, the re-configurable low noise amplifier utilizing feedback capacitors comprises an input transistor, an output portion, and a capacitor feedback part. The input transistor has one terminal connected to a capacitor and a first inductor and is used for amplifying a received signal to be an amplified signal. The output portion is configured to output the amplified signal. The output portion has a plurality of output transistors and each output transistor has one terminal connected to another terminal of the input transistor. Each output transistor is configured to be switched according to a frequency band of the amplified signal in a wide band of frequencies. The capacitor feedback part has a capacitance distributor arranged at the gate electrode of the input transistor and connected to another terminal of each output transistor. The capacitance distributor is configured to adjust a gain and to match an input impedance and an output impedance of the re-configurable low noise amplifier with feedback.

In addition, the output portion of the present invention comprises a plurality of inductors respectively coupled to the output transistors. The output transistors are separately arranged according to a plurality of specific frequency bands. Each output transistor is controlled ON/OFF by applying a bias voltage to the gate electrode of each output transistor for switching the frequency band of the amplified signal to one specific frequency band corresponding thereto.

In addition, the output portion of the present invention further comprises a plurality of variable capacitors. The plural variable capacitors form common nodes with the inductors of the output portion. The plural variable capacitors respectively connect to another terminal of the output transistors. The plural variable capacitors are used for adjusting harmonic frequencies corresponding to the plural specific frequency bands.

In addition, the capacitor feedback part comprises a second capacitor and a plurality of first capacitors. The plural first capacitors respectively couple to common nodes formed by a plurality of inductors of the output portion and the output transistors, and respectively couple between the common nodes and the gate electrode of the input transistor. The second capacitor couples between the gate electrode of the input transistor and ground.

The present invention has advantages as follows. The output impedance feeds back to the gate electrode of the input transistor so that the output portion at high impedance maintains without adding an additional circuit in the input portion. Adding the additional circuit may affect noise figure of the main circuit. When input matching, the frequency variation of signals in the output portion can instantly reflect to the input portion. Capacitance distributors are used in the present invention. By altering the capacitance value of capacitors of the capacitance distributors, the gain is easier to be adjusted. The low noise amplifier of the present invention not only makes applicable to kinds of communication standards, but also fulfills high gain and low noise figure.

In addition, the present invention has further advantages as follows. The low noise amplifier of the present invention includes output transistors having a switch function, and capacitor switch cells for adjusting a harmonic frequency. A specific frequency band in a wide band of frequencies is selected by the switch function of the output transistors. The capacitor switch cells are able to adjust an appropriate harmonic frequency according to the frequency range devised in kinds of communication standards. Therefore, the gain of the low noise amplifier is increased.

In addition, the present invention has other advantages as follows. The low noise amplifier of the present invention is able to shrank chip area and reduce cost of manufacture. Therefore, the present invention conforms to the tendency of device miniaturization. The present invention satisfies the characteristic of operation in a wide band of frequencies. In the mean while, high gain and low noise figure are achieved. In comparison with a single designed low noise amplifier, the efficiency of the low noise amplifier of the present invention is remarkably improved. The low noise amplifier is applicable to wireless communication standards and suitable for the frequency range devised in kinds of communication standards.

DETAILED DESCRIPTION OF THE INVENTION

The present invention will be described in details in conjunction with the appending drawings.

Figure 1:
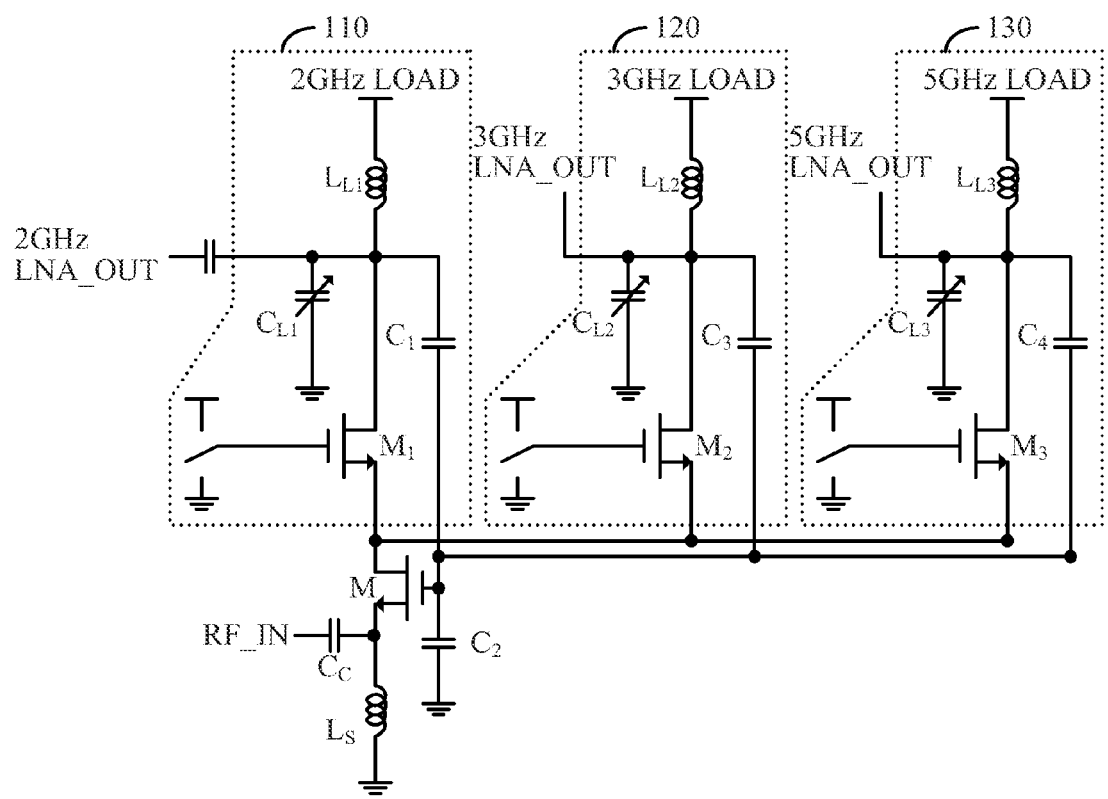
FIG. 1 shows a circuit diagram of a re-configurable low noise amplifier utilizing feedback capacitors in the present invention.

According to a preferred embodiment of the present invention, a re-configurable low noise amplifier utilizing feedback capacitors includes an input transistor, an output portion, and a capacitor feedback part, as shown in FIG. 1. The input transistor amplifies a signal received from an antenna. The output portion has a function of switching frequency bands in a wide band of frequencies and is capable of switching to the frequency band of the signal amplified by the input transistor. The capacitor feedback part has a capacitance distributor configured to adjust a gain and configured for input matching by feeding the output impedance of the output portion back to the input impedance of the re-configurable low noise amplifier.

To fulfill the characteristic of operation in a wide band of frequencies, the present invention maintains the output portion at high impedance, instead of using a load with low impedance. The high impedance of the output portion is also used for input matching. In addition, the output portion has a plurality of output transistors. The function of frequency band selection is achieved by switching the output transistors ON/OFF. In the output portion, the present invention also adjusts harmonic frequencies corresponding to specific frequency bands for achieving a higher gain.

The aforesaid input transistor (M) can be a metal-oxide-semiconductor (MOS) transistor. The input transistor (M) has one terminal connected to a capacitor (Cc) and an inductor (Ls). The signal (RF_IN) received from an antenna is inputted to the input transistor (M) via the capacitor (Cc). The input transistor (M) amplifies the signal (RF_IN). The input transistor (M) has another terminal connected to each output transistor (M1, M2, M3) of the output portion. The selection of the frequency band of the amplified signal is achieved by switching the output transistors (M1, M2, M3) ON/OFF. In addition, an input portion is consisted of the input transistor (M), the capacitor (Cc), and the inductor (Ls).

To maintain the output portion at high impedance for a wide band of frequencies, the aforesaid output portion has inductors ($L_{L1}$, $L_{L2}$, $L_{L3}$) respectively corresponding to operating frequency bands (e.g. 2 GHz, 3 GHz, and 5 GHz). Moreover, to fulfill the selection of operating frequency bands, each output transistor (M1, M2, M3) has one terminal connected to the input transistor (M) so that a cascade transistor circuit is formed. The output transistor (M1, M2, M3) is controlled ON/OFF by applying a bias voltage to the gate electrode of the output transistor (M1, M2, M3). Therefore, the output transistor (M1, M2, M3) acts as a switch and fulfills the selection of operating frequency bands.

By applying a bias voltage to the gate electrode of the output transistor (M1, M2, M3) to control the output transistor (M1, M2, M3) ON/OFF, the present invention is able to use operating frequency bands as required and thus satisfies the characteristic of operation in a wide band of frequencies. For example, when outputting the received signal, the received signal is outputted in a first frequency band 110 with 2 GHz main frequency, a second frequency band 120 with 3 GHz main frequency, or a third frequency band 130 with 5 GHz main frequency.

For applying to various frequency bands, the aforesaid output portion further comprises a plurality of variable capacitors ($C_{L1}$, $C_{L1}$, $C_{L3}$). For the variable capacitor ($C_{L1}$), the variable capacitor ($C_{L1}$) connects to another terminal of the output transistor (M1). After an appropriate frequency band is selected through the switch function of the output transistor (M1), the present invention changes the capacitance value of the variable capacitor ($C_{L1}$) for adjusting an appropriate harmonic frequency according to the selected frequency band. In addition, a common node is formed between the variable capacitor ($C_{L1}$) and the inductor ($L_{L1}$). The aforesaid another terminal of the output transistor (M1) connects to the common node.

Figure 3:
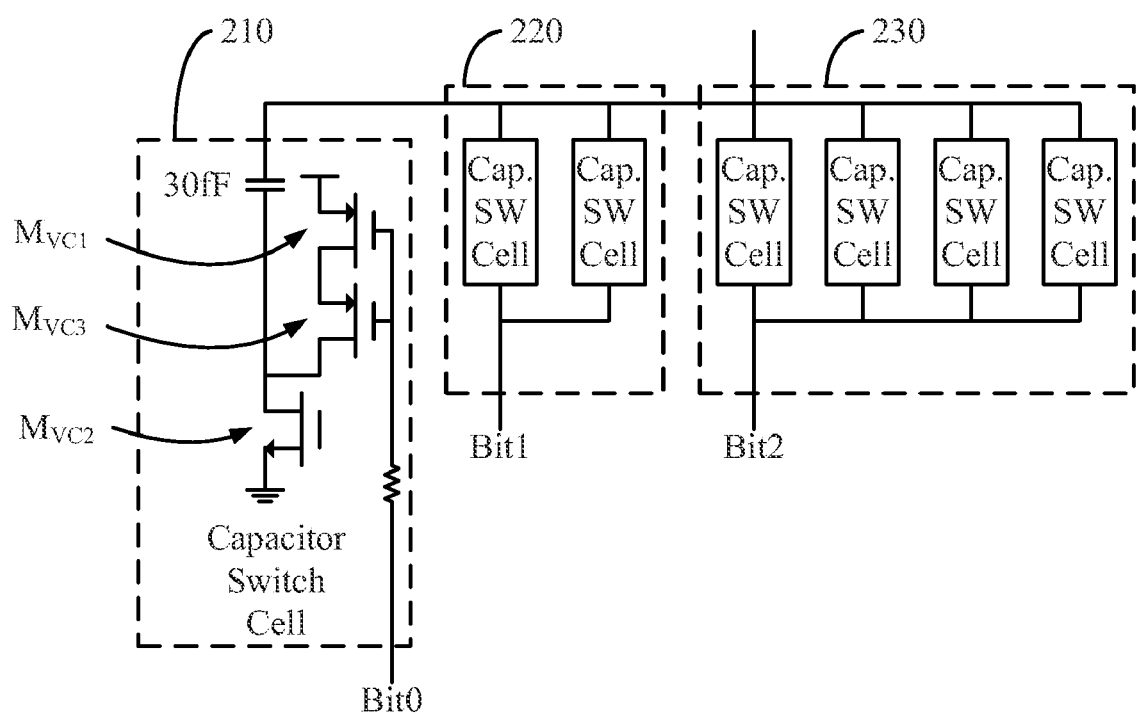
FIG. 3 shows a simplified circuit diagram of a variable capacitor of the present invention.

As shown in FIG. 3, the variable capacitor ($C_{L1}$) is consisted of a plurality of capacitor switch cells (Cap. SW Cell). Each capacitor switch cell comprises a first transistor ($M_{VC1}$), a second transistor ($M_{VC2}$), a third transistor ($M_{VC3}$), a resistor, and a regulating capacitor. A common node is formed between the resistor and the gate electrode of each transistor ($M_{VC1}$, $M_{VC2}$, $M_{VC3}$). Digital controlling signals (Bit0, Bit1, Bit2) are transmitted to the gate electrode of each transistor ($M_{VC1}$, $M_{VC2}$, $M_{VC3}$) via the common node. The first transistor ($M_{VC1}$) has one terminal connected to a power supply; the second transistor ($M_{VC2}$) has one terminal connected to the ground; and the third transistor ($M_{VC3}$) has two terminals respectively connected to the first transistor ($M_{VC1}$) and the second transistor ($M_{VC2}$). For clear and concise description, FIG. 3 only shows a first capacitor switch cell set 210 in detail. The Other capacitor switch cells have similar structures as the first capacitor switch cell set 210. The regulating capacitor cooperates with the inductor ($L_{L1}$) of the output portion for adjusting the aforesaid harmonic frequency. The capacitance value of the regulating capacitor should be appropriately selected to cooperate with the inductor ($L_{L1}$).

The aforesaid regulating capacitor connects to a common node formed between the second transistor ($M_{VC2}$) and the third transistor ($M_{VC3}$). The regulating capacitor has one terminal connected to the inductor ($L_{L1}$). For adjusting the harmonic frequency, an appropriate capacitance value of the regulating capacitor should be selected to cooperate with the inductor ($L_{L1}$). In the present embodiment, the appropriate capacitance value of the regulating capacitor is 30 fF (femtofarad).

In addition, the aforesaid variable capacitor ($C_{L1}$) comprises a first capacitor switch cell set 210, a second capacitor switch cell set 220, and a third capacitor switch cell set 230. The first capacitor switch cell set 210 has one capacitor switch cell and is controlled by a first digital controlling signal (Bit0). The second capacitor switch cell set 220 has two capacitor switch cells and is controlled by a second digital controlling signal (Bit2). The third capacitor switch cell set 230 has four capacitor switch cells and is controlled by a third digital controlling signal (Bit3).

When the first capacitor switch cell set 210 is selected, the capacitance value of the variable capacitor ($C_{L1}$) is 30 fF; when the second capacitor switch cell set 220 is selected, the capacitance value of the variable capacitor ($C_{L1}$) is 60 fF; when the third capacitor switch cell set 230 is selected, the capacitance value of the variable capacitor ($C_{L1}$) is 120 fF.

Figure 4:
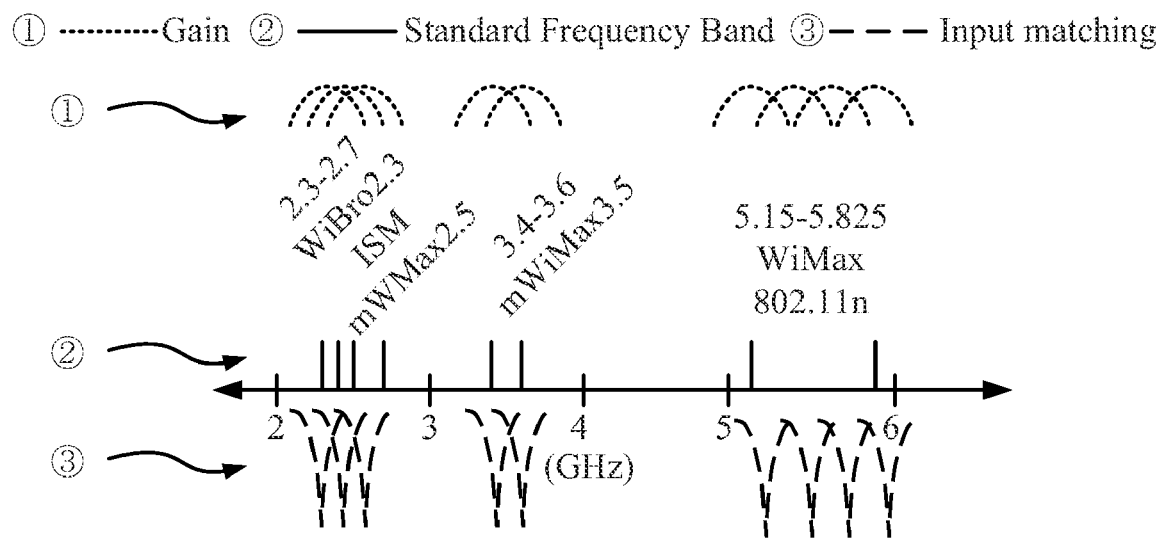
FIG. 4 shows a comparison of voltage gain of a low noise amplifier applicable to various frequency bands in the present invention.

After a specific frequency band is selected, a number of the aforesaid capacitor switch cells may be selected to cooperate with the main circuit according to the selected specific frequency band. The selected capacitor switch cells result in a slight variation of harmonic frequency as shown in FIG. 4. When input matching (③) comprises various harmonic frequencies, a higher gain (①) is achieved.

FIG. 4 shows a comparison of voltage gains of the low noise amplifier applicable to various frequency bands in the present invention. FIG. 4 also shows a variation of harmonic frequency which is resulted from a 3-bits digital controlling signal.

When the selected specific frequency band is at 2 GHz main frequency, according to stand frequency band (②) in a frequency range of 2.3 to 2.7 GHz, the capacitance value of the variable capacitor ($C_{L1}$) is adjusted for selecting an appropriate harmonic frequency for input matching. For example, the appropriate harmonic frequency is 2.3 GHz for mWiBro (a standard used in Korea); and the appropriate harmonic frequency is 2.5 GHz for mWiMax. The specific frequency band with 3 GHz main frequency and the specific frequency band with 5 GHz main frequency have a similar way for frequency band selection.

The aforesaid capacitor feedback part comprises first capacitors ($C_1$, $C_3$, $C_4$) and a second capacitor ($C_2$), as shown in FIG. 1. The first capacitors ($C_1$, $C_3$, $C_4$) are respectively coupled to common nodes formed by the inductors ($L_{L1}$, $L_{L2}$, $L_{L3}$) and the output transistors (M1, M2, M3) of the output portion, and respectively coupled between the common nodes and the gate electrode of the input transistor (M). The second capacitor ($C_2$) is coupled between the gate electrode of the input transistor (M) and the ground.

Figure 2:
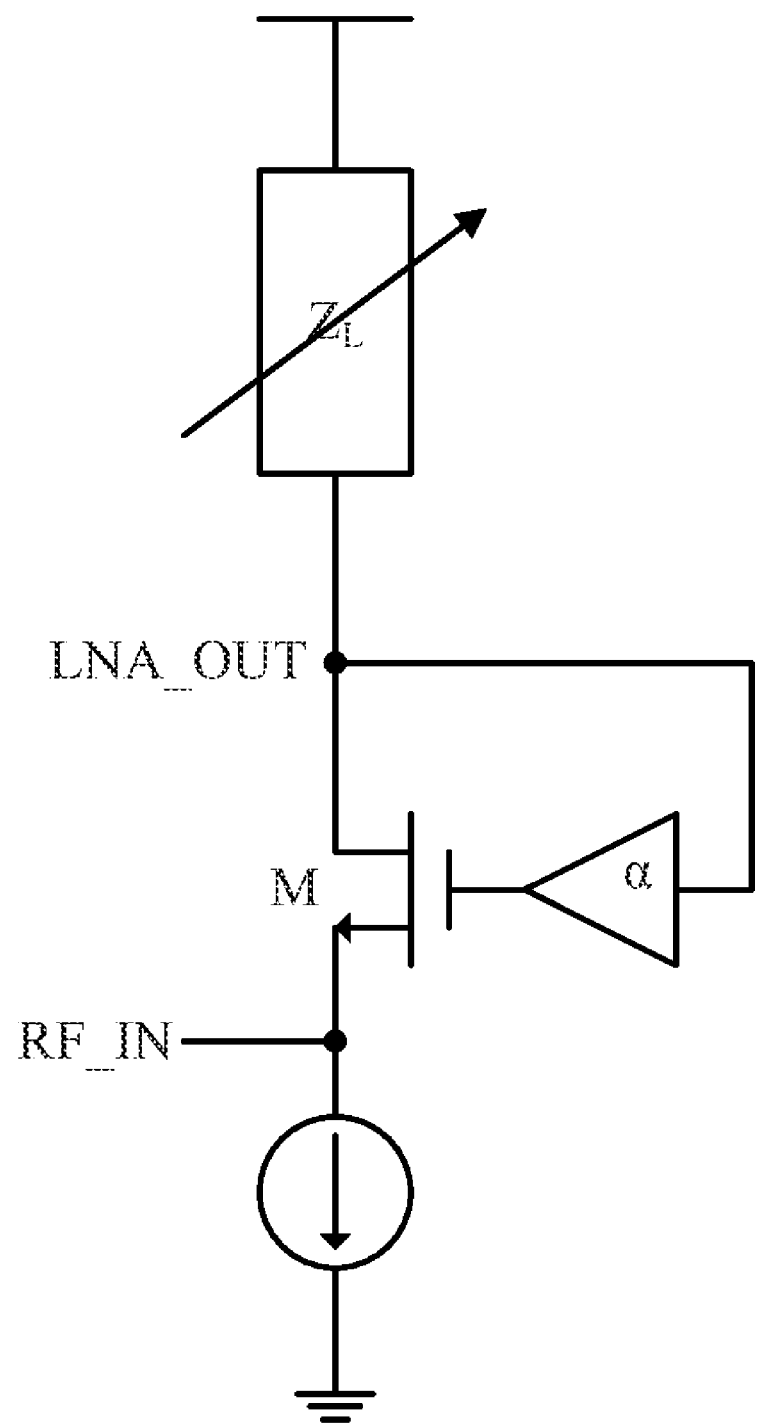
FIG. 2 shows a circuit diagram of a capacitor feedback part of the present invention.

As shown in FIG. 2, an output impedance ($Z_L$) varies with different specific frequency bands and feeds back to an input impedance for input matching.

The aforesaid signal (RF_IN) from the antenna is inputted to source electrode of the input transistor (M). An output voltage of the output portion is amplified. After amplifying, the output voltage is inputted to the gate electrode of the input transistor (M). The aforesaid capacitor feedback part is consisted of capacitance distributors. For 2 GHz load, the capacitance distributor comprises the first capacitor ($C_1$) and the second capacitor ($C_2$). The gain (a) of the feedback circuit of the present invention is defined as $\alpha = (C_1/C_2)$. It is apparently that the gain may be altered by changing the capacitance of the first capacitor ($C_1$).

The input impedance ($Z_{IN}$) of the low noise amplifier of the present invention is represented as:

$$Z_{IN} \approx \frac{1}{g_m} + \alpha Z_L + \frac{Z_L}{g_m r_0}, \quad (1)$$

where $Z_L$ represents an impedance of load of the output portion, $g_m$ represents a transconductance of the input transistor, $\alpha$ represents a gain of the feedback circuit, and $r_o$ represents a resistance of output transistor. Generally, the input impedance of a common gate amplifier is $1/g_m$. In comparison with the common gate amplifier, the low noise amplifier of the present invention has the capacitor feedback part. As shown in equation (1), the input impedance ($Z_{IN}$) correlates with the output impedance ($Z_L$) in the present invention.

The present invention is applicable in a wide band of frequencies. The output impedance ($Z_L$) varies with the selected specific frequency band. Since the output impedance ($Z_L$) will feed back to the input impedance ($Z_{IN}$) for input matching, the present invention can change input matching frequency without adding an additional circuit in the input portion.

In addition, the noise figure (NF) in the present embodiment is represented as:

$$NF \approx 1 + \frac{\gamma}{g_m R_s} + \frac{R_s}{R_L(\omega_0)}, \quad (2)$$

where $R_S$ represents an impedance in source electrode, $\gamma$ is a constant. Generally, when input matching is processed in a common gate amplifier, $g_m$ is a fixed value. However, when input matching is processed in the present invention, the input impedance ($Z_{IN}$) is increasing due to affection of the component $\alpha Z_L$. In the meanwhile, $g_m$ also increases. Therefore, the noise figure of the low noise amplifier of the present invention is much lower.

In addition, the closed loop gain $A_{CL}$ and the open loop gain $A_{CL}$ of the low noise amplifier of the present invention are represented as:

$$A_{CL} = \frac{A_{OL}}{1 + \alpha A_{OL}}. \quad (3)$$

When the gain $\alpha$ affecting the output impedance feeding back to the input impedance is small, the transconductance $g_m$ and the output impedance $Z_L$ thus become larger. Therefore, the low noise amplifier of the present invention as a whole has advantages of low noise figure and high gain.

In addition, only using the input transistor (M) to amplify the signal (RF_IN) received from the antenna will generate parasitic capacitance resided in the output portion and result in high noise figure and low gain. To reduce the affection of the parasitic component, the present invention classifies the signal (RF_IN) into 2 GHz and 3 GHz frequency bands of relative low frequency, and 5 GHz frequency bands of relative high frequency. The input transistor (M) cooperates with each output transistor (M1, M2, M3), and the switch function is achieved by applying a bias voltage to each output transistor (M1, M2, M3). Therefore, a selection of a specific frequency band is finished with an aid of the output transistors (M1, M2, M3).

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A re-configurable low noise amplifier utilizing feedback capacitors, comprising:
   an input transistor, having one terminal connected to a capacitor and a first inductor, for amplifying a received signal to be an amplified signal;
   an output portion, configured to output the amplified signal, wherein the output portion has a plurality of output transistors and each output transistor has one terminal connected to another terminal of the input transistor, and wherein said each output transistor is configured to be switched according to a frequency band of the amplified signal in a wide band of frequencies; and
   a capacitor feedback part, having a capacitance distributor arranged at a gate electrode of the input transistor and connected to another terminal of said each output transistor, wherein the capacitance distributor is configured to adjust a gain and configured for input matching by feeding the output impedance of the re-configurable low noise amplifier back to the input impedance of the re-configurable low noise amplifier.

2. The re-configurable low noise amplifier of claim 1, wherein the output portion comprises:
   a plurality of inductors, respectively coupled to the output transistors, wherein the output transistors are separately arranged according to a plurality of specific frequency bands, and said each output transistor is controlled ON/OFF for switching the frequency band of the amplified signal to one specific frequency band corresponding thereto.

3. The re-configurable low noise amplifier of claim 2, wherein the plural specific frequency bands comprise a first frequency band with 2 GHz main frequency, a second frequency band with 3 GHz main frequency, and a third frequency band with 5 GHz main frequency for outputting the received signal.

4. The re-configurable low noise amplifier of claim 3, wherein the output portion further comprises:
   a plurality of variable capacitors, forming common nodes with the inductors of the output portion respectively and being respectively connected to said another terminal of the output transistors, for adjusting harmonic frequencies corresponding to the plural specific frequency bands.

5. The re-configurable low noise amplifier of claim 4, wherein each variable capacitor is consisted of at least one capacitor switch cell, said capacitor switch cell comprising:
   a first transistor, having one terminal connected to a power supply;
   a second transistor, having one terminal connected to ground;
   a third transistor, having two terminals respectively connected to the first transistor and the second transistor;
   a resistor, having one terminal to couple with the gate electrodes of the first transistor, the second transistor, and the third transistor, and having another terminal to receive a digital controlling signal, wherein the digital controlling signal is employed for controlling selection of said capacitor switch cell; and
   a regulating capacitor, coupled to the second transistor, wherein a capacitance value of the regulating capacitor is regulated depending on at least one of the inductors and at least one harmonic frequency.

6. The re-configurable low noise amplifier of claim 5, wherein each variable capacitor comprises:
   a first capacitor switch cell set, controlled by a first digital controlling signal, having one said capacitor switch cell;
   a second capacitor switch cell set, controlled by a second digital controlling signal, having two said capacitor switch cells; and
   a third capacitor switch cell set, controlled by a third digital controlling signal, having four said capacitor switch cells.

7. The re-configurable low noise amplifier of claim 6, wherein the capacitance value in the first capacitor switch cell set is 30 fF, the capacitance value in the second capacitor switch cell set is 60 fF, and the capacitance value in the third capacitor switch cell set is 120 fF.

8. The re-configurable low noise amplifier of claim 1, wherein the capacitor feedback part comprises:
   a plurality of first capacitors, respectively coupled to common nodes formed by a plurality of inductors of the output portion and the output transistors, and respectively coupled between the common nodes and the gate electrode of the input transistor; and
   at least one second capacitor, coupled between the gate electrode of the input transistor and ground.

9. The re-configurable low noise amplifier of claim 8, wherein a voltage of the output portion amplified with an amount of gain is applied to the gate electrode of the input transistor, and wherein the amount of gain is equal to a computing result of one of the first capacitors divided by the second capacitor.

10. The re-configurable low noise amplifier of claim 9, wherein the input impedance is determined by an impedance equation for matching the output impedance in various frequency bands.

11. The re-configurable low noise amplifier of claim 10, wherein the impedance equation is represented as:

$$Z_{IN} \approx \frac{1}{g_m} + \alpha Z_L + \frac{Z_L}{g_m r_0}, \tag{1}$$

where $Z_L$ represents an impedance of load in the output portion, $g_m$ represents a transconductance of the input transistor, $\alpha$ represents a capacitance ratio of the capacitor feedback part, and $r_o$ represents an output resistance of said output transistor.

12. The re-configurable low noise amplifier of claim 3, wherein said each output transistor is controlled ON/OFF by applying a bias voltage to the gate electrode of said each output transistor for operating the re-configurable low noise amplifier in the first frequency band, second frequency band, or third frequency band, and the input impedance of the re-configurable low noise amplifier depends on the input transistor and one output transistor switched on.

* * * * *